(12) United States Patent
Levy et al.

(10) Patent No.: US 9,355,849 B1
(45) Date of Patent: May 31, 2016

(54) OXIDE-NITRIDE-OXIDE STACK HAVING MULTIPLE OXYNITRIDE LAYERS

(71) Applicant: Cypress Semiconductor Corporation, San Jose, CA (US)

(72) Inventors: Sagy Charel Levy, Zichron Yaakov (IL); Krishnaswamy Ramkumar, San Jose, CA (US); Fredrick B. Jenne, Mountain House, CA (US); Sam G. Geha, Cupertino, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 13/917,500

(22) Filed: Jun. 13, 2013

Related U.S. Application Data

(63) Continuation of application No. 11/811,958, filed on Jun. 13, 2007, now abandoned.

(60) Provisional application No. 60/931,947, filed on May 25, 2007.

(51) Int. Cl.
  *H01L 21/28* (2006.01)
  *H01L 21/02* (2006.01)

(52) U.S. Cl.
  CPC ...... *H01L 21/28282* (2013.01); *H01L 21/0214* (2013.01)

(58) Field of Classification Search
  CPC ................... H01L 21/02326; H01L 21/28202
  USPC .................................................. 438/261, 264
  See application file for complete search history.

(56) References Cited

U.S. PATENT DOCUMENTS

| | | | |
|---|---|---|---|
| 4,395,438 | A | 7/1983 | Chiang |
| 4,490,900 | A | 1/1985 | Chiu |
| 4,543,707 | A | 10/1985 | Ito et al. |
| 4,667,217 | A | 5/1987 | Janning |
| 4,843,023 | A | 6/1989 | Chiu et al. |

(Continued)

FOREIGN PATENT DOCUMENTS

| | | |
|---|---|---|
| CN | 1832201 A | 9/2006 |
| CN | 101558481 A | 10/2009 |

(Continued)

OTHER PUBLICATIONS

USPTO Non Final Rejection for U.S. Appl. No. 11/811,958 dated May 13, 2009; 14 pages.

(Continued)

*Primary Examiner* — Mohammad Choudhry

(57) ABSTRACT

A semiconductor device including an oxide-nitride-oxide (ONO) structure having a multi-layer charge storing layer and methods of forming the same are provided. Generally, the method involves: (i) forming a first oxide layer of the ONO structure; (ii) forming a multi-layer charge storing layer comprising nitride on a surface of the first oxide layer; and (iii) forming a second oxide layer of the ONO structure on a surface of the multi-layer charge storing layer. Preferably, the charge storing layer comprises at least two silicon oxynitride layers having differing stochiometric compositions of Oxygen, Nitrogen and/or Silicon. More preferably, the ONO structure is part of a silicon-oxide-nitride-oxide-silicon (SONOS) structure and the semiconductor device is a SONOS memory transistor. Other embodiments are also disclosed.

17 Claims, 4 Drawing Sheets

(56) References Cited

U.S. PATENT DOCUMENTS

| | | |
|---|---|---|
| 4,870,470 A | 9/1989 | Bass, Jr. et al. |
| 5,348,903 A | 9/1994 | Pfiester et al. |
| 5,404,791 A | 4/1995 | Kervagoret |
| 5,405,791 A | 4/1995 | Ahmad et al. |
| 5,408,115 A | 4/1995 | Chang |
| 5,464,783 A | 11/1995 | Kim et al. |
| 5,500,816 A | 3/1996 | Kobayashi |
| 5,573,963 A | 11/1996 | Sung |
| 5,773,343 A | 6/1998 | Lee et al. |
| 5,793,089 A | 8/1998 | Fulford et al. |
| 5,817,170 A | 10/1998 | Desu et al. |
| 5,847,411 A | 12/1998 | Morii |
| 5,861,347 A | 1/1999 | Maiti et al. |
| 5,937,323 A | 8/1999 | Orczyk et al. |
| 5,939,333 A | 8/1999 | Hurley et al. |
| 5,972,765 A | 10/1999 | Clark et al. |
| 5,972,804 A | 10/1999 | Tobin et al. |
| 6,001,713 A | 12/1999 | Ramsbey et al. |
| 6,015,739 A | 1/2000 | Gardner et al. |
| 6,020,606 A | 2/2000 | Liao |
| 6,023,093 A | 2/2000 | Gregor et al. |
| 6,025,267 A | 2/2000 | Pey et al. |
| 6,074,915 A | 6/2000 | Chen et al. |
| 6,114,734 A | 9/2000 | Eklund |
| 6,127,227 A | 10/2000 | Lin et al. |
| 6,136,654 A | 10/2000 | Kraft et al. |
| 6,140,187 A | 10/2000 | DeBusk et al. |
| 6,147,014 A | 11/2000 | Lyding et al. |
| 6,150,286 A | 11/2000 | Sun et al. |
| 6,153,543 A | 11/2000 | Chesire et al. |
| 6,157,426 A | 12/2000 | Gu |
| 6,162,700 A | 12/2000 | Hwang et al. |
| 6,174,774 B1 | 1/2001 | Lee |
| 6,214,689 B1 | 4/2001 | Lim et al. |
| 6,217,658 B1 | 4/2001 | Orczyk et al. |
| 6,218,700 B1 | 4/2001 | Papadas |
| 6,268,299 B1 | 7/2001 | Jammy et al. |
| 6,277,683 B1 | 8/2001 | Pradeep et al. |
| 6,297,096 B1 | 10/2001 | Boaz |
| 6,297,173 B1 | 10/2001 | Tobin et al. |
| 6,321,134 B1 | 11/2001 | Henley et al. |
| 6,335,288 B1 | 1/2002 | Kwan et al. |
| 6,348,380 B1 | 2/2002 | Weimer et al. |
| 6,365,518 B1 | 4/2002 | Lee et al. |
| 6,399,484 B1 | 6/2002 | Yamasaki et al. |
| 6,406,960 B1 | 6/2002 | Hopper et al. |
| 6,429,081 B1 | 8/2002 | Doong et al. |
| 6,433,383 B1 | 8/2002 | Ramsbey et al. |
| 6,440,797 B1 | 8/2002 | Wu et al. |
| 6,444,521 B1 | 9/2002 | Chang et al. |
| 6,445,030 B1 | 9/2002 | Wu et al. |
| 6,461,899 B1 | 10/2002 | Kitakado et al. |
| 6,468,927 B1 | 10/2002 | Zhang et al. |
| 6,469,343 B1 | 10/2002 | Miura et al. |
| 6,518,113 B1 | 2/2003 | Buynoski |
| 6,559,026 B1 | 5/2003 | Rossman et al. |
| 6,586,343 B1 | 7/2003 | Ho et al. |
| 6,586,349 B1 | 7/2003 | Jeon et al. |
| 6,596,590 B1 | 7/2003 | Miura et al. |
| 6,599,795 B2 | 7/2003 | Ogata |
| 6,602,771 B2 | 8/2003 | Inoue et al. |
| 6,610,614 B2 | 8/2003 | Niimi et al. |
| 6,624,090 B1 * | 9/2003 | Yu et al. .................... 438/769 |
| 6,661,065 B2 | 12/2003 | Kunikiyo |
| 6,670,241 B1 | 12/2003 | Kamal et al. |
| 6,677,213 B1 | 1/2004 | Ramkumar et al. |
| 6,709,928 B1 | 3/2004 | Jenne et al. |
| 6,713,127 B2 | 3/2004 | Subramony et al. |
| 6,717,860 B1 | 4/2004 | Fujiwara |
| 6,730,566 B2 | 5/2004 | Niimi et al. |
| 6,746,968 B1 | 6/2004 | Tseng et al. |
| 6,768,160 B1 | 7/2004 | Li et al. |
| 6,768,856 B2 | 7/2004 | Akwani et al. |
| 6,774,433 B2 | 8/2004 | Lee et al. |
| 6,787,419 B2 | 9/2004 | Chen et al. |
| 6,818,558 B1 | 11/2004 | Rathor et al. |
| 6,833,582 B2 | 12/2004 | Mine et al. |
| 6,835,621 B2 | 12/2004 | Yoo et al. |
| 6,884,681 B1 | 4/2005 | Kamal et al. |
| 6,903,422 B2 | 6/2005 | Goda et al. |
| 6,906,390 B2 | 6/2005 | Nomoto et al. |
| 6,912,163 B2 | 6/2005 | Zheng et al. |
| 6,913,961 B2 | 7/2005 | Hwang |
| 6,917,072 B2 | 7/2005 | Noguchi et al. |
| 6,946,349 B1 | 9/2005 | Lee et al. |
| 6,958,511 B1 | 10/2005 | Halliyal et al. |
| 7,012,299 B2 | 3/2006 | Mahajani et al. |
| 7,015,100 B1 | 3/2006 | Lee et al. |
| 7,018,868 B1 | 3/2006 | Yang et al. |
| 7,033,890 B2 | 4/2006 | Shone |
| 7,033,957 B1 | 4/2006 | Shiraiwa et al. |
| 7,042,054 B1 | 5/2006 | Ramkumar et al. |
| 7,045,424 B2 | 5/2006 | Kim et al. |
| 7,060,594 B2 | 6/2006 | Wang |
| 7,084,032 B2 | 8/2006 | Crivelli et al. |
| 7,098,154 B2 | 8/2006 | Yoneda |
| 7,112,486 B2 | 9/2006 | Cho et al. |
| 7,115,469 B1 | 10/2006 | Halliyal et al. |
| 7,172,940 B1 | 2/2007 | Chen et al. |
| 7,238,990 B2 | 7/2007 | Burnett et al. |
| 7,250,654 B2 | 7/2007 | Chen et al. |
| 7,253,046 B2 | 8/2007 | Higashi et al. |
| 7,262,457 B2 | 8/2007 | Hsu et al. |
| 7,279,740 B2 | 10/2007 | Bhattacharyya et al. |
| 7,301,185 B2 | 11/2007 | Chen et al. |
| 7,312,496 B2 | 12/2007 | Hazama |
| 7,315,474 B2 | 1/2008 | Lue |
| 7,323,742 B2 | 1/2008 | Georgescu |
| 7,338,869 B2 | 3/2008 | Fukada et al. |
| 7,365,389 B1 | 4/2008 | Jeon et al. |
| 7,372,113 B2 | 5/2008 | Tanaka et al. |
| 7,390,718 B2 | 6/2008 | Roizin et al. |
| 7,410,857 B2 | 8/2008 | Higashi et al. |
| 7,450,423 B2 | 11/2008 | Lai et al. |
| 7,463,530 B2 | 12/2008 | Lue et al. |
| 7,479,425 B2 | 1/2009 | Ang et al. |
| 7,482,236 B2 | 1/2009 | Lee et al. |
| 7,521,751 B2 | 4/2009 | Fujiwara |
| 7,535,053 B2 | 5/2009 | Yamazaki |
| 7,544,565 B2 | 6/2009 | Kwak et al. |
| 7,576,386 B2 | 8/2009 | Lue et al. |
| 7,588,986 B2 | 9/2009 | Jung |
| 7,601,576 B2 | 10/2009 | Suzuki et al. |
| 7,612,403 B2 | 11/2009 | Bhattacharyya |
| 7,636,257 B2 | 12/2009 | Lue |
| 7,642,585 B2 | 1/2010 | Wang et al. |
| 7,646,041 B2 | 1/2010 | Chae et al. |
| 7,646,637 B2 | 1/2010 | Liao |
| 7,670,963 B2 | 3/2010 | Ramkumar et al. |
| 7,688,626 B2 | 3/2010 | Lue et al. |
| 7,692,246 B2 | 4/2010 | Dreeskornfeld et al. |
| 7,714,379 B2 | 5/2010 | Lee |
| 7,723,789 B2 | 5/2010 | Lin et al. |
| 7,790,516 B2 | 9/2010 | Willer et al. |
| 7,879,738 B2 | 2/2011 | Wang |
| 7,910,429 B2 | 3/2011 | Dong et al. |
| 7,927,951 B2 | 4/2011 | Kim et al. |
| 7,948,799 B2 | 5/2011 | Lue et al. |
| 7,999,295 B2 | 8/2011 | Lai et al. |
| 8,008,713 B2 | 8/2011 | Dobuzinsky et al. |
| 8,063,434 B1 | 11/2011 | Polishchuk et al. |
| 8,067,284 B1 | 11/2011 | Levy |
| 8,093,128 B2 | 1/2012 | Koutny, Jr. et al. |
| 8,143,129 B2 | 3/2012 | Ramkumar et al. |
| 8,163,660 B2 | 4/2012 | Puchner et al. |
| 8,222,688 B1 | 7/2012 | Jenne et al. |
| 8,264,028 B2 | 9/2012 | Lue et al. |
| 8,283,261 B2 | 10/2012 | Ramkumar |
| 8,315,095 B2 | 11/2012 | Lue et al. |
| 8,318,608 B2 | 11/2012 | Ramkumar et al. |
| 8,482,052 B2 | 7/2013 | Lue et al. |
| 2001/0052615 A1 | 12/2001 | Fujiwara |
| 2002/0020890 A1 | 2/2002 | Willer |
| 2002/0141237 A1 | 10/2002 | Goda et al. |

(56) References Cited

U.S. PATENT DOCUMENTS

| | | |
|---|---|---|
| 2002/0154878 A1 | 10/2002 | Akwani et al. |
| 2003/0030100 A1 | 2/2003 | Lee et al. |
| 2003/0122204 A1 | 7/2003 | Nomoto et al. |
| 2003/0123307 A1 | 7/2003 | Lee et al. |
| 2003/0124873 A1 | 7/2003 | Xing et al. |
| 2003/0169629 A1 | 9/2003 | Goebel et al. |
| 2003/0183869 A1 | 10/2003 | Crivelli et al. |
| 2003/0227049 A1 | 12/2003 | Sakakibara |
| 2004/0067619 A1 | 4/2004 | Niimi et al. |
| 2004/0071030 A1 | 4/2004 | Goda et al. |
| 2004/0094793 A1 | 5/2004 | Noguchi et al. |
| 2004/0104424 A1 | 6/2004 | Yamazaki |
| 2004/0129986 A1 | 7/2004 | Kobayashi et al. |
| 2004/0129988 A1 | 7/2004 | Rotondaro et al. |
| 2004/0173918 A1 | 9/2004 | Kamal et al. |
| 2004/0183091 A1 | 9/2004 | Hibino |
| 2004/0183122 A1 | 9/2004 | Mine et al. |
| 2004/0207002 A1 | 10/2004 | Ryu et al. |
| 2004/0227196 A1 | 11/2004 | Yoneda |
| 2004/0227198 A1 | 11/2004 | Mitani et al. |
| 2004/0251489 A1 | 12/2004 | Jeon et al. |
| 2005/0026637 A1 | 2/2005 | Fischer et al. |
| 2005/0056892 A1 | 3/2005 | Seliskar |
| 2005/0070126 A1 | 3/2005 | Senzaki |
| 2005/0079659 A1 | 4/2005 | Duan et al. |
| 2005/0093054 A1 | 5/2005 | Jung |
| 2005/0098839 A1 | 5/2005 | Lee et al. |
| 2005/0116279 A1 | 6/2005 | Koh |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0224866 A1 | 10/2005 | Higashi et al. |
| 2005/0227501 A1 | 10/2005 | Tanabe et al. |
| 2005/0230766 A1 | 10/2005 | Nomoto et al. |
| 2005/0236679 A1 | 10/2005 | Hori et al. |
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0017092 A1 | 1/2006 | Dong et al. |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 | 6/2006 | Wang |
| 2006/0113627 A1 | 6/2006 | Chen et al. |
| 2006/0131636 A1 | 6/2006 | Jeon et al. |
| 2006/0160303 A1 | 7/2006 | Ang et al. |
| 2006/0192248 A1 | 8/2006 | Wang |
| 2006/0202261 A1 | 9/2006 | Lue et al. |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228841 A1 | 10/2006 | Kim et al. |
| 2006/0228899 A1 | 10/2006 | Nansei et al. |
| 2006/0228907 A1 | 10/2006 | Cheng et al. |
| 2006/0237803 A1 | 10/2006 | Zhu et al. |
| 2006/0261401 A1 | 11/2006 | Bhattacharyya |
| 2006/0281331 A1 | 12/2006 | Wang |
| 2007/0012988 A1 | 1/2007 | Bhattacharyya |
| 2007/0029625 A1 | 2/2007 | Lue et al. |
| 2007/0031999 A1 | 2/2007 | Ho et al. |
| 2007/0048916 A1 | 3/2007 | Suzuki et al. |
| 2007/0049048 A1 | 3/2007 | Rauf et al. |
| 2007/0051306 A1 | 3/2007 | Ivanov et al. |
| 2007/0066087 A1 | 3/2007 | Jung |
| 2007/0121380 A1 | 5/2007 | Thomas |
| 2007/0200168 A1 | 8/2007 | Ozawa et al. |
| 2007/0210371 A1 | 9/2007 | Hisamoto et al. |
| 2007/0215940 A1 | 9/2007 | Ligon |
| 2007/0246753 A1 | 10/2007 | Chu et al. |
| 2007/0262451 A1 | 11/2007 | Rachmady et al. |
| 2007/0272916 A1 | 11/2007 | Wang et al. |
| 2007/0272971 A1 | 11/2007 | Lee et al. |
| 2008/0009115 A1 | 1/2008 | Willer et al. |
| 2008/0029399 A1 | 2/2008 | Tomita et al. |
| 2008/0048237 A1 | 2/2008 | Iwata |
| 2008/0057644 A1 | 3/2008 | Kwak et al. |
| 2008/0087942 A1 | 4/2008 | Hsu et al. |
| 2008/0121932 A1 | 5/2008 | Ranade |
| 2008/0146042 A1 | 6/2008 | Kostamo et al. |
| 2008/0150003 A1 | 6/2008 | Chen et al. |
| 2008/0175053 A1 | 7/2008 | Lue et al. |
| 2008/0237684 A1 | 10/2008 | Specht et al. |
| 2008/0237694 A1 | 10/2008 | Specht et al. |
| 2008/0258203 A1 | 10/2008 | Happ et al. |
| 2008/0272424 A1 | 11/2008 | Kim et al. |
| 2008/0286927 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0291726 A1 | 11/2008 | Lue et al. |
| 2008/0293207 A1 | 11/2008 | Koutny, Jr. et al. |
| 2008/0293255 A1 | 11/2008 | Ramkumar |
| 2008/0296664 A1 | 12/2008 | Ramkumar et al. |
| 2009/0011609 A1 | 1/2009 | Ramkumar et al. |
| 2009/0039414 A1 | 2/2009 | Lue et al. |
| 2009/0045452 A1 | 2/2009 | Lue et al. |
| 2009/0179253 A1 | 7/2009 | Levy et al. |
| 2009/0206385 A1 | 8/2009 | Kim et al. |
| 2009/0227116 A1 | 9/2009 | Joo et al. |
| 2009/0302365 A1 | 12/2009 | Bhattacharyya |
| 2010/0117138 A1 | 5/2010 | Huerta et al. |
| 2010/0117139 A1 | 5/2010 | Lue |
| 2010/0155823 A1 | 6/2010 | Lue et al. |
| 2010/0252877 A1 | 10/2010 | Nakanishi et al. |
| 2011/0018053 A1 | 1/2011 | Lo et al. |
| 2011/0163371 A1 | 7/2011 | Song et al. |
| 2011/0237060 A1 | 9/2011 | Lee et al. |
| 2011/0248332 A1 | 10/2011 | Levy et al. |
| 2012/0068159 A1 | 3/2012 | Fujiki et al. |
| 2013/0175604 A1 | 7/2013 | Polishchuk et al. |

FOREIGN PATENT DOCUMENTS

| | | |
|---|---|---|
| JP | 2005347679 | 12/2005 |
| JP | 2007515060 A | 6/2007 |
| JP | 2007318112 | 12/2007 |
| KR | 2006100092 * | 9/2006 |
| TW | 200703671 | 7/2005 |
| WO | 2007064048 A1 | 6/2007 |
| WO | 2011162725 A | 12/2011 |

OTHER PUBLICATIONS

USPTO Non Final Rejection for U.S. Appl. No. 11/811,958 dated Oct. 7, 2010; 12 pages.

USPTO Non Final Rejection for U.S. Appl. No. 11/811,958 dated Dec. 7, 2011; 13 pages.

USPTO Non Final Rejection for U.S. Appl. No. 11/904,475 dated Apr. 12, 2011; 14 pages.

USPTO Non Final Rejection for U.S. Appl. No. 11/904,475 dated Apr. 27, 2010; 12 pages.

USPTO Non Final Rejection for U.S. Appl. No. 11/904,513 dated Dec. 10, 2008; 11 pages.

USPTO Non Final Rejection for U.S. Appl. No. 11/904,505 dated Feb. 3, 2011; 13 pages.

USPTO Non Final Rejection for U.S. Appl. No. 11/904,506 dated Aug. 31, 2010; 17 pages.

USPTO Non Final Rejection for U.S. Appl. No. 12/005,813 dated Apr. 13, 2010; 8 pages.

USPTO Non Final Rejection for U.S. Appl. No. 12/005,813 dated Sep. 23, 2011; 12 pages.

USPTO Non Final Rejection for U.S. Appl. No. 12/006,961 dated Jun. 24, 2010; 8 pages.

USPTO Non Final Rejection for U.S. Appl. No. 12/080,166 dated Jun. 30, 2010; 11 pages.

USPTO Non Final Rejection for U.S. Appl. No. 12/125,864 dated Nov. 17, 2010; 19 pages.

USPTO Non Final Rejection for U.S. Appl. No. 12/185,747 dated Aug. 6, 2009; 15 pages.

(56) References Cited

OTHER PUBLICATIONS

USPTO Non Final Rejection for U.S. Appl. No. 12/767,105 dated Apr. 21, 2011; 7 pages.
USPTO Non Final Rejection for U.S. Appl. No. 12/767,105 dated Oct. 18, 2011; 7 pages.
USPTO Non Final Rejection for U.S. Appl. No. 13/007,533 dated Apr. 12, 2012; 9 pages.
USPTO Non Final Rejection for U.S. Appl. No. 13/114,889 dated Sep. 5, 2013; 11 pages.
USPTO Non Final Rejection for U.S. Appl. No. 13/114,889 dated Nov. 25, 2011; 13 pages.
USPTO Non Final Rejection for U.S. Appl. No. 13/288,919 dated Dec. 5, 2013; 4 pages.
USPTO Non Final Rejection for U.S. Appl. No. 13/431,069 dated Aug. 16, 2013; 7 pages.
USPTO Non Final Rejection for U.S. Appl. No. 13/539,458 dated Mar. 13, 2013; 5 pages.
USPTO Non Final Rejection for U.S. Appl. No. 13/551,237 dated Jul. 18, 2013; 6 pages.
USPTO Non-Final Office Action for U.S. Appl. No. 13/539,466 dated Sep. 28, 2012; 9 pages.
USPTO Non-Final Rejection for U.S. Appl. No. 09/920,378 dated Oct. 21, 2002; 10 pages.
USPTO Non-Final Rejection for U.S. Appl. No. 10/185,470 dated Feb. 24, 2004; 6 pages.
USPTO Non-Final Rejection for U.S. Appl. No. 10/185,470 dated Oct. 16, 2003; 7 pages.
USPTO Non-Final Rejection for U.S. Appl. No. 10/740,205 dated Jun. 29, 2004; 5 pages.
USPTO Non-Final Rejection for U.S. Appl. No. 11/811,958 dated Oct. 7, 2010; 12 pages.
USPTO Non-Final Rejection for U.S. Appl. No. 11/904,506 dated Feb. 3, 2011; 13 pages.
USPTO Non-Final Rejection for U.S. Appl. No. 12/005,813 dated Jun. 18, 2013; 6 pages.
USPTO Non-Final Rejection for U.S. Appl. No. 12/030,644 dated May 28, 2010; 19 pages.
USPTO Non-Final Rejection for U.S. Appl. No. 12/124,855 dated Jan. 18, 2011; 5 pages.
USPTO Non-Final Rejection for U.S. Appl. No. 12/124,855 dated Aug. 16, 2011; 9 pages.
USPTO Non-Final Rejection for U.S. Appl. No. 12/124,855 dated Oct. 29, 2009; 9 pages.
USPTO Non-Final Rejection for U.S. Appl. No. 12/125,864 dated Apr. 27, 2009; 17 pages.
USPTO Non-Final Rejection for U.S. Appl. No. 12/125,864 dated Nov. 13, 2009; 19 pages.
USPTO Non-Final Rejection for U.S. Appl. No. 12/185,747 dated Jul. 1, 2010; 12 pages.
USPTO Non-Final Rejection for U.S. Appl. No. 12/185,747 dated Aug. 6, 2009; 15 pages.
USPTO Non-Final Rejection for U.S. Appl. No. 12/185,751 dated Aug. 4, 2009; 19 pages.
USPTO Non-Final Rejection for U.S. Appl. No. 12/197,466 dated Jun. 1, 2011; 11 pages.
USPTO Non-Final Rejection for U.S. Appl. No. 13/114,889 dated Oct. 10, 2012; 11 pages.
USPTO Non-Final Rejection for U.S. Appl. No. 13/436,878 dated Jul. 24, 2013; 12 pages.
USPTO Notice of Allowance for U.S. Appl. No. 09/920,378 dated Nov. 10, 2003; 5 pages.
USPTO Notice of Allowance for U.S. Appl. No. 10/185,470 dated Jul. 16, 2004; 4 pages.
USPTO Notice of Allowance for U.S. Appl. No. 10/740,205 dated Jun. 15, 2005; 6 pages.
USPTO Notice of Allowance for U.S. Appl. No. 11/904,506 dated Sep. 16, 2013; 8 pages.
USPTO Notice of Allowance for U.S. Appl. No. 11/904,506 dated Oct. 28, 2013; 9 pages.
USPTO Notice of Allowance for U.S. Appl. No. 11/904,513 dated Oct. 9, 2009; 7 pages.
USPTO Notice of Allowance for U.S. Appl. No. 11/983,578 dated Jun. 25, 2013; 11 pages.
USPTO Notice of Allowance for U.S. Appl. No. 12/005,813 dated Sep. 8, 2010; 7 pages.
USPTO Notice of Allowance for U.S. Appl. No. 12/005,813 dated Nov. 20, 2013; 10 pages.
USPTO Notice of Allowance for U.S. Appl. No. 12/006,961 dated Mar. 15, 2011; 8 pages.
USPTO Notice of Allowance for U.S. Appl. No. 12/006,961 dated Jul. 26, 2011; 8 pages.
USPTO Notice of Allowance for U.S. Appl. No. 12/006,961 dated Oct. 14, 2010; 4 pages.
USPTO Notice of allowance for U.S. Appl. No. 12/080,166 dated Sep. 1, 2011; 9 pages.
USPTO Notice of Allowance for U.S. Appl. No. 12/080,166 dated Mar. 31, 2011; 7 pages.
USPTO Notice of Allowance for U.S. Appl. No. 12/080,166 dated Sep. 30, 2010; 6 pages.
USPTO Notice of Allowance for U.S. Appl. No. 12/080,175 dated May 14, 2010; 10 pages.
USPTO Notice of Allowance for U.S. Appl. No. 12/124,855 dated May 1, 2012; 7 pages.
USPTO Notice of Allowance for U.S. Appl. No. 12/124,855 dated May 3, 2011; 7 pages.
USPTO Notice of Allowance for U.S. Appl. No. 12/124,855 dated Jul. 28, 2010; 6 pages.
USPTO Notice of Allowance for U.S. Appl. No. 12/124,855 dated Aug. 1, 2012; 7 pages.
USPTO Notice of Allowance for U.S. Appl. No. 12/125,864 dated Apr. 19, 2011; 11 pages.
USPTO Notice of Allowance for U.S. Appl. No. 12/125,864 dated Oct. 31, 2011; 6 pages.
USPTO Notice of Allowance for U.S. Appl. No. 12/185,747 dated Feb. 13, 2012; 6 pages.
USPTO Notice of Allowance for U.S. Appl. No. 12/185,747 dated Jul. 11, 2011; 6 pages.
USPTO Notice of Allowance for U.S. Appl. No. 12/185,747 dated Nov. 17, 2010; 8 pages.
USPTO Notice of Allowance for U.S. Appl. No. 12/185,751 dated Jan. 13, 2014; 8 pages.
USPTO Notice of Allowance for U.S. Appl. No. 12/185,751 dated Jan. 31, 2011; 5 pages.
USPTO Notice of Allowance for U.S. Appl. No. 12/185,751 dated Feb. 24, 2010; 7 pages.
USPTO Notice of Allowance for U.S. Appl. No. 12/185,751 dated Apr. 6, 2012; 7 pages.
USPTO Notice of Allowance for U.S. Appl. No. 12/185,751 dated May 15, 2013; 9 pages.
USPTO Notice of Allowance for U.S. Appl. No. 12/185,751 dated Jun. 25, 2013; 9 pages.
USPTO Notice of Allowance for U.S. Appl. No. 12/185,751 dated Aug. 11, 2010; 7 pages.
USPTO Notice of Allowance for U.S. Appl. No. 12/185,751 dated Oct. 20, 2011; 6 pages.
USPTO Notice of Allowance for U.S. Appl. No. 12/185,751 dated Nov. 2, 2012; 7 pages.
USPTO Notice of Allowance for U.S. Appl. No. 12/197,466 dated Jun. 15, 2012; 4 pages.
USPTO Notice of Allowance for U.S. Appl. No. 12/197,466 dated Sep. 24, 2012; 8 pages.
USPTO Notice of Allowance for U.S. Appl. No. 12/767,105 dated Apr. 4, 2012; 8 pages.
USPTO Notice of Allowance for U.S. Appl. No. 12/767,105 dated May 7, 2012; 7 pages.
USPTO Notice of Allowance for U.S. Appl. No. 13/007,533 dated Mar. 7, 2013; 8 pages.
USPTO Notice of Allowance for U.S. Appl. No. 13/007,533 dated Jun. 18, 2013; 9 pages.
USPTO Notice of Allowance for U.S. Appl. No. 13/007,533 dated Sep. 6, 2013; 9 pages.

(56) References Cited

OTHER PUBLICATIONS

USPTO Notice of Allowance for U.S. Appl. No. 13/007,533 dated Nov. 27, 2012; 13 pages.
USPTO Notice of Allowance for U.S. Appl. No. 13/007,533 dated Dec. 6, 2013; 10 pages.
USPTO Notice of Allowance for U.S. Appl. No. 13/428,201 dated Aug. 5, 2013; 12 pages.
USPTO Notice of Allowance for U.S. Appl. No. 13/428,201 dated Oct. 4, 2013; 11 pages.
USPTO Notice of Allowance for U.S. Appl. No. 13/428,201 dated Dec. 30, 2013; 11 pages.
USPTO Notice of Allowance for U.S. Appl. No. 13/431,069 dated Jan. 2, 2014; 8 pages.
USPTO Notice of Allowance for U.S. Appl. No. 13/431,069 dated Nov. 8, 2013; 9 pages.
USPTO Notice of Allowance for U.S. Appl. No. 13/539,458 dated May 24, 2013; 8 pages.
USPTO Notice of Allowance for U.S. Appl. No. 13/539,466 dated Sep. 4, 2013; 9 pages.
USPTO Requirement for Restriction for U.S. Appl. No. 12/185,751 dated Apr. 20, 2009; 7 pages.
USPTO Requirement for Restriction for U.S. Appl. No. 12/767,105 dated Mar. 1, 2011; 6 pages.
USPTO Requirement for Restriction for U.S. Appl. No. 13/007,533 dated Dec. 6, 2011; 7 pages.
USPTO Requirement for Restriction for U.S. Appl. No. 13/114,889 dated Sep. 7, 2011; 6 pages.
USPTO Requirement for Restriction for U.S. Appl. No. 13/436,878 dated Apr. 15, 2013; 5 pages.
USPTO Requirement for Restriction for U.S. Appl. No. 13/551,237 dated Jun. 17, 2013; 5 pages.
USPTO Requirement for Restriction/Election for U.S. Appl. No. 09/920,378 dated Jul. 22, 2002; 4 pages.
USPTO Requirement for Restriction/Election for U.S. Appl. No. 12/185,747 dated Apr. 20, 2009; 7 pages.
USPTO Requirement Restriction for U.S. Appl. No. 10/094,108 dated Dec. 3, 2002; 4 pages.
USPTO Requirement Restriction for U.S. Appl. No. 12/197,466 dated Mar. 11, 2011; 5 pages.
USPTO Restriction Requirement for U.S. Appl. No. 13/436,875 dated Oct. 18, 2013; 8 pages.
Wang, Szu-Yu et al., "Reliability and processing effects of bandgap engineered SONOS flash memory", 2007 IEEE, International Reliability Symposium, Apr. 18, 2007, 5 pgs.
Written Opinion of the International Searching Authority for International Application No. PCT/13US/32777 dated Jun. 20, 2013; 7 pages.
Written Opinion of the International Searching Authority for International Application No. PCT/US07/20966 mailed Apr. 21, 2008; 1 pages.
Written Opinion of the International Searching Authority for International Application No. PCT/US07/20988 mailed Mar. 14, 2008; 1 page.
Written Opinion of the International Searching Authority for International Application No. PCT/US08/06627 mailed Aug. 26, 2008; 5 pages.
Written Opinion of the International Searching Authority for International Application No. PCT/US12/21583 mailed May 8, 2012; 4 pages.
Written Opinion of the International Searching Authority for International Application No. PCT/US13/29784 mailed May 20, 2013; 6 pages.
Written Opinion of the International Searching Authority for International Application No. PCT/US13/32339 mailed May 30, 2013; 7 pages.
Written Opinion of the International Searching Authority for International Application No. PCT/US2013/048874 mailed Dec. 16, 2013; 7 pages.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999) 2025-2032.
U.S. Appl. No. 13/539,461: "SONOS Ono Stack Scaling," Fredrick Jenne, filed on Jul. 1, 2012; 91 pages.
U.S. Appl. No. 13/620,071: "Method of Fabricating a Nonvolatile Charge Trap Memory Device" Krishnaswamy Ramkumar et al., filed on Sep. 14, 2012; 69 pages.
Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.
Chinese Office Action for Application No. 200880000820.3 dated Jan. 26, 2011; 6 pages.
Claims Last Amended for U.S. Appl. No. 13/007,533 dated Jun. 12, 2012; 7 pages.
Hua-Ching Chien, Chin-Hsing Kao, Jui-Wen Chang and Tzung-Kuen Tsai_Two-bit SONOS type Flash using a band engineering in the nitride layer_Dated Jun. 17, 2005_4 pages.
International Search Report for International Application No. PCT/US07/20966 dated Apr. 21, 2008; 2 pages.
International Search Report for International Application No. PCT/US07/20988 dated Mar. 14, 2008; 2 pages.
International Search Report for International Application No. PCT/US08/06597 dated Aug. 19, 2008; 2 pages.
International Search Report for International Application No. PCT/US12/021583 dated May 8, 2012; 2 pages.
International Search Report for International Application No. PCT/US13/29784 dated May 20, 2013; 2 pages.
International Search Report for International Application No. PCT/US13/32339 dated May 30, 2013; 2 pages.
International Search Report for International Application No. PCT/US13/32777 dated Jun. 20, 2013; 2 pages.
International Search Report for International Application No. PCT/US13/48876 dated Jul. 26, 2013; 5 pages.
International Search Report for International Application No. PCT/US2008/006627 dated Aug. 26, 2008; 2 pages.
International Search Report for International Application No. PCT/US2013/048874 dated Dec. 16, 2013; 2 pages.
Krishnaswamy Ramkumar_Cypress SONOS Technology_Dated Jul. 6, 2011_9 pages.
Lue et al., "BE-SONOS: A Bandgap Engineered SONOS with Excellent Performance and Reliability," IEEE, 2005; 4 pages.
Lue, Hang-Ting et al., "Reliability Model of Bandgap Engineered SONOS (be-SONOS)", IEEE, 2006, 4 pgs.
Milton Ohring, "The Materials Science of Thin Films: Deposition and Structure," 2nd Edition, Academic Press, 2002, pp. 336-337; 4 pages.
U.S. Appl. No. 11/904,506: "SONOS ONO stack scaling," Fredrick B. Jenne, filed on Sep. 26, 2007; 46 pages.
U.S. Appl. No. 11/904,513: "Single Wafer Process for Fabricating a NonVolatile Charge Trap Memory Device" Krishnaswamy Ramkumar et al., filed on Sep. 26, 2007; 35 pages.
U.S. Appl. No. 12/005,813: "Nitridation Oxidation of Tunneling Layer for Improved Sonos Speed and Retention" Sagy Levy et al., filed on Dec. 27, 2007; 31 pages.
U.S. Appl. No. 12/030,644: "NonVolatile Charge Trap Memory Device Having a High Dielectric Constant Blocking Region" Igor Polishchuk et al., filed on Feb. 13, 2008; 37 pages.
U.S. Appl. No. 12/080,166: "Sequential Deposition and Anneal of a Dielectic Layer in a Charge Trapping Memory Device" Krishnaswamy Ramkumar et al., filed Mar. 31, 2008; 33 pages.
U.S. Appl. No. 12/080,175: "Plasma Oxidation of a Memory Layer to Form a Blocking Layer in Non Volatile Charge Trap Memory Devices" Krishnaswamy Ramkumar et al., filed on Mar. 31, 2008; 37 pages.
U.S. Appl. No. 12/125,864 "Integration of Non-Volatile Charge Trap Memory Devices and Logic CMOS Devices" William W.C. Koutny Jr et al, Filed on May 22, 2008; 65 pages.
U.S. Appl. No. 12/197,466: "Radical Oxidation Process for Fabricating a Nonvolatile Charge Trap Memory Device," Ramkumar et al., filed on Aug. 25, 2008; 68 pages.

(56) References Cited

OTHER PUBLICATIONS

U.S. Appl. No. 12/767,105: "Sonos Stack With Split Intride Memory Layer" Fredrick Jenne et al., filed on Apr. 26, 2010; 32 pages.
U.S. Appl. No. 13/428,201: "Method of Integrating a Charge-Trapping Gate Stack Into a CMOS Flow" Krishnaswamy Ramkumar et al., filed on Mar. 23, 2012; 38 Pages.
U.S. Appl. No. 13/436,872: "Oxide-Nitride-Oxide Stack Having Multiple Oxynitride Layers" Sagy Levy, Zichron-Yoakev et al., filed on Mar. 31, 2012; 53 pages.
U.S. Appl. No. 13/436,875: "Nonvolatile Charge Trap Memory Device Having a High Dielectric Constant Blocking Region" Igor Polishchuk et al., filed on Mar. 31, 2012; 70 Pages.
U.S. Appl. No. 13/436,878: "Integration of Non-Volatile Charge Trap Memory Devices and Logic CMOS Devices" Krishnaswamy Ramkumar et al., filed on Mar. 31, 2012; 90 pages.
U.S. Appl. No. 13/539,458: "Radical Oxidation Process for Fabricating a Nonvolatile Charge Trap Memory Device"., filed on Jul. 1, 2012; 96 pages.
U.S. Appl. No. 60/931,947: "Oxide-nitride-Oxide Stack Having Multiple Oxynitride Layers" Sagy Levy et al., filed on May 25, 2007; 27 pages.
U.S. Appl. No. 60/931,948: "SONOS stack with oxynitride bilayer made of BTBAS and NH3" Sagy Levy et al., filed on May 25, 2007; 11 Pages.
U.S. Appl. No. 60/940,128: "Single Wafer Process for ONO Stack" Krishnaswamy Ramkumar et al., filed on May 25, 2007; 3 pages.
U.S. Appl. No. 60/940,384: "SONOS ONO Stack Scaling" Frederick Jenne et al., filed on May 25, 2007; 33 Pages.
U.S. Appl. No. 61/007,566: "Nonvolatile Charge Trap Memory Device Having a High Dielectric Constant Blocking Region" Igor Polishchuk et al., filed on Dec. 12, 2007; 37 pages.
U.S. Appl. No. 61/599,258 "New Integration of SONOS Stack" Krishnaswamy Ramkumar et al., filed on Feb. 15, 2012: 4 pages.
SIPO Office Action for Application No. 200910134374.1 dated Aug. 19, 2014; 5 pages.
USPTO Notice of Allowance for U.S. Appl. No. 13/539,466 dated Nov. 13, 2013; 9 pages.
USPTO Notice of Allowance for U.S. Appl. No. 13/539,466 dated Nov. 27, 2012; 8 pages.
USPTO Notice of Allowance for U.S. Appl. No. 13/551,237 dated Oct. 29, 2013; 9 pages.
USPTO Notice of Allowance for U.S. Appl. No. 13/551,237 dated Dec. 10, 2013; 9 pages.
USPTO Requirement for Restriction for U.S. Appl. No. 11/904,475 dated Jan. 8, 2010; 8 pages.
USPTO Requirement for Restriction for U.S. Appl. No. 11/904,506 dated Apr. 13, 2010; 7 pages.
USPTO Requirement for Restriction for U.S. Appl. No. 11/904,513 dated Oct. 7, 2008; 8 pages.
USPTO Requirement for Restriction for U.S. Appl. No. 12/030,644 dated Oct. 7, 2009; 11 pages.
USPTO Requirement for Restriction for U.S. Appl. No. 12/080,166 dated Mar. 19, 2010; 6 pages.
USPTO Requirement for Restriction for U.S. Appl. No. 12/080,175 dated Feb. 3, 2010; 6 pages.
USPTO Requirement for Restriction for U.S. Appl. No. 12/152,518 dated Jun. 9, 2010; 5 pages.
"MAX 9000 Programmable Logic Device Family," Altera, Jul. 1999, Version 6.01, pp. 1-40; 41 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.
"1.8V, 500-MHz, 10-Output JEDEC-Compliant Zero Delay Buffer," Cypress Advance Information, Feb. 12, 2004; 9 pages.
"10 Gigabit Ethernet Technology Overview White Paper", Revision 1.0, Retrieved from Internet: URL: http://www.10gea.org, May 2001.

"16Kx8/9 Dual-Port Static RAM with Sem, Int, Busy," Cypress Semiconductor Data Book, May 1995, CY7C006 and CY7C016, pp. 6:1-17; 10 pages.
"1Kx8 Dual-Port Static RAM," Cypress Semiconductor Data Book, May 1995, CY7C130/CY7C131 and CY7C140/CY7C141, pp. 6:37-49; 8 pages.
"1kHz to 30MHz Resistor Set SOT-23 Oscillator", Initial Release Final Electrical Specifications LTC1799, Linear Technology Corporation, Jan. 2001, pp. 1-4.
"200-MBaud HOTLink Transceiver," Cypress Semiconductor Corporation, Revised Feb. 13, 2004, CY7C924ADX, Document #38-02008 Rev. *D; 62 pages.
"2Kx16 Dual-Port Static RAM," Cypress Semiconductor Data Book, May 1995, CY7C133 and CY7C143, pp. 6:63-73; 7 pages.
"2Kx8 Dual-Port Static RAM," Cypress Semiconductor Data Book, May 1995, CY7C132/CY7C136 and CY7C142/CY7C146, pp. 6:50-62; 8 pages.
"3.3V 64Kx18 Synchronous QuadPort Static RAM," Cypress Preliminary CY7C0430BV, Cypress Semiconductor Corporation, Mar. 27, 2001; 36 pages.
"A Novel Integration Technology of EEPROM Embedded CMOS Logic VLSI Suitable for ASIC Applications", By Masataka Takebuchi et al., IEEE 1992 Custom Integrated Circuits Conference, pp. 9.6.1-9.6.4.
"A Novel Robust and Low Cost Stack Chips Package and Its Thermal Performance", By Soon-Jin Cho et al., IEEE Transaction on Advanced Packaging, vol. 23, No. 2, May 2000, pp. 257-265.
"A Planar Type EEPROM Cell Structure by Standard CMOS Process for Integration with Gate Array, Standard Cell, Microprocessor and for Neural Chips", By Katsuhiko Ohsaki et al., IEEE 1993 Custom Integrated Circuits Conference, pp. 23.6.1-23.6.4.
"A Single Chip Sensor & Image Processor for Fingerprint Verification" Anderson, S., et al., IEEE Custom Integrated Circuits Conference, May 12-15, 1991.
"A Single Poly EPROM for Custom CMOS Logic Applications", By Reza Kazerounian et al., IEEE 1986 Custom Integrated Circuits Conference, pp. 59-62.
"A Wide-Bandwidth Low-Voltage PLL for PowerPC.TM. Microprocessors", By Jose Alvarez et al., IEEE Journal of Solid-State Circuits, vol. 30, No. 4, Apr. 1995, pp. 383-391.
"About SMaL Camera Technologies, Inc.", SMaL Camera Technologies, 2001, 1 page.
"Achieving Uniform nMOS Device Power Distribution for Sub-micron ESD Reliability;" Charvaka Duvvuy, Carlos Diaz, and Tim Haddock; 1992; 92-131 through 92-134, no month.
"ADNS-2030 High Performance, Low Power Optical Mouse Sensor (Optimized for Cordless Mouse Applications)," Agilent Technologies, downloaded Oct. 10, 2005, <http://www.home.agilent.com/USeng/nav/-536893734,536883737/pd.html>, 2 pages.
"ADNS-2051 High-Performance Optical Mouse Sensor," Agilent Technologies, downloaded Oct. 10, 2005, <http://www.home.agilent.com/USeng/nav/-536893734,5368837371pd.html>; 2 pages.
"Agilent ADNK-2030 Solid-State Optical Mouse Sensor," Agilent Technologies Inc., Sample Kit, 2003; 1 page.
"Agilent ADNS-2030 Low Power Optical Mouse Sensor," Agilent Technologies Inc., Data Sheet, 2005; 34 pages.
"Agilent ADNS-2051 Optical Mouse Sensor," Agilent Technologies Inc., Product Overview, 2003; 2 pages.
"Agilent Optical Mouse Sensors," Agilent Technologies Inc., Selection Guide, 2004; 3 pages.
"Algorithm for Managing Multiple First-In, First-Out Queues from a Single Shared Random-Access Memory," IBM Technical Disclosure Bulletin, Aug. 1989; 5 pages.
"Am99C10A 256.times.48 Content Addressable Memory", Advanced Micro Devices, Dec. 1992.
"An Analog PPL-Based Clock and Data Recovery Circuit with High Input Jitter Tolerance;" Sun, Reprinted from IEEE Journal of Solid-State Circuits, 1989; 4 pages.
"An EEPROM for Microprocessors and Custom Logic", By Roger Cuppens et al., IEEE Journal of Solid-State Circuits, vol. SC-20, No. 2, Apr. 1985, pp. 603-608.

(56) References Cited

OTHER PUBLICATIONS

"An EPROM Cell Structure foe EPLDs Compatible with Single Poly Gate Process", By Kuniyushi Yoshikawa et al., Extended Abstracts of the 18th (1986 International) Conference on Solid State Devices and Materials, Tokyo, 1986, pp. 323-326.

"An Experimental 5-V-Only 256-kbit CMOS EEPROM with a High-Performance Single-Polysilicon Cell", By Jun-Ichi Miyamoto et al., IEEE Journal of Solid State Circuits, vol. SC-21, No. 5, Oct. 1986, pp. 852-860.

* cited by examiner

OXIDE-NITRIDE-OXIDE STACK HAVING MULTIPLE OXYNITRIDE LAYERS

CROSS-REFERENCE TO RELATED APPLICATIONS

This application is a continuation of U.S. application Ser. No. 11/811,958, filed Jun. 13, 2007, which claims priority to U.S. Provisional Patent Application No. 60/931,947, filed May 25, 2007, all of which are incorporated by reference herein in their entirety.

TECHNICAL FIELD

This invention relates to semiconductor processing and, more particularly to an oxide-nitride-oxide stack having an improved oxide-nitride or oxynitride layer and methods of forming the same.

BACKGROUND OF THE INVENTION

Non-volatile semiconductor memories, such as a split gate flash memory, typically use a stacked floating gate type field effect transistors, in which electrons are induced into a floating gate of a memory cell to be programmed by biasing a control gate and grounding a body region of a substrate on which the memory cell is formed.

An oxide-nitride-oxide (ONO) stack is used as either a charge storing layer, as in silicon-oxide-nitride-oxide-silicon (SONOS) transistor, or as an isolation layer between the floating gate and control gate, as in a split gate flash memory.

FIG. 1 is a partial cross-sectional view of an intermediate structure for a semiconductor device 100 having a SONOS gate stack or structure 102 including a conventional ONO stack 104 formed over a surface 106 of a silicon substrate 108 according to a conventional method. In addition, the device 100 typically further includes one or more diffusion regions 110, such as source and drain regions, aligned to the gate stack and separated by a channel region 112. Briefly, the SONOS structure 102 includes a poly-silicon (poly) gate layer 114 formed upon and in contact with the ONO stack 104. The poly gate 114 is separated or electrically isolated from the substrate 108 by the ONO stack 104. The ONO stack 104 generally includes a lower oxide layer 116, a nitride or oxynitride layer 118 which serves as a charge storing or memory layer for the device 100, and a top, high-temperature oxide (HTO) layer 120 overlying the nitride or oxynitride layer.

One problem with conventional SONOS structures 102 and methods of forming the same is the poor data retention of the nitride or oxynitride layer 118 that limits the device 100 lifetime and/or its use in several applications due to leakage current through the layer.

Another problem with conventional SONOS structures 102 and methods of forming the same is the stochiometry of the oxynitride layer 118 is neither uniform nor optimized across the thickness of the layer. In particular, the oxynitride layer 118 is conventionally formed or deposited in a single step using a single process gas mixture and fixed or constant processing conditions in an attempt to provide a homogeneous layer having a high nitrogen and high oxygen concentration across the thickness of the relatively thick layer. However, due to top and bottom effects this results in nitrogen, oxygen and silicon concentrations, which can vary throughout the conventional oxynitride layer 118. The top effect is caused by the order in which process gases are shut off following deposition. In particular, the silicon containing process gas, such as silane, is typically shut off first resulting in a top portion of the oxynitride layer 118 that is high in oxygen and/or nitride and low in silicon. Similarly, the bottom effect is caused by the order in which process gases are introduced to initiate deposition. In particular, the deposition of the oxynitride layer 118 typically follows an annealing step, resulting in a peak or relatively high concentration of ammonia ($NH_3$) at the beginning of the deposition process and producing in a bottom portion of the oxynitride layer that is low in oxygen and silicon and high in nitrogen. The bottom effect is also due to surface nucleation phenomena in which that oxygen and silicon that is available in the initial process gas mixture preferentially reacts with silicon at the surface of the substrate and does not contribute to the formation of the oxynitride layer. Consequently, the charge storage characteristics, and in particular programming and erase speed and data retention of a memory device 100 made with the ONO stack 104, are adversely effected.

Accordingly, there is a need for a memory device having an ONO stack with an oxynitride layer as a memory layer that exhibits improved programming and erase speed and data retention. There is a further need for a method or process of forming an ONO stack having an oxynitride layer that exhibits improved oxynitride stochiometry.

The present invention provides a solution to these and other problems, and offers further advantages over conventional ONO stacks or memory layers and methods of forming the same.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

Figure 1:
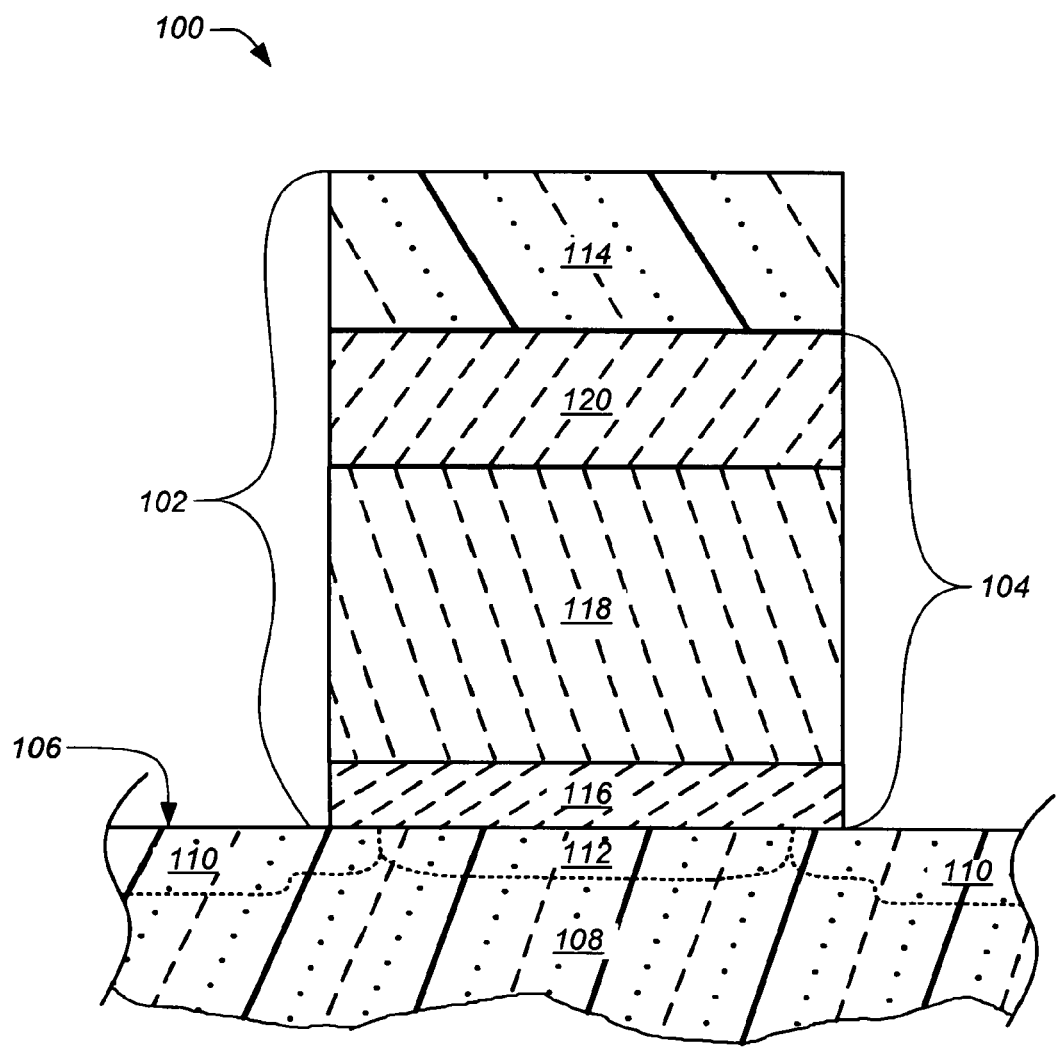
FIG. 1 (prior art) is a block diagram illustrating a cross-sectional side view of an intermediate structure for a memory device for which a method having an oxide-nitride-oxide (ONO) stack formed according to conventional method.

The present invention is directed generally to an oxide-nitride-oxide (ONO) structure including a multi-layer charge storing layer and methods for making the same. The ONO structure and method are particularly useful for forming a memory layer in a memory device, such as a silicon-oxide-nitride-oxide-silicon (SONOS) memory transistor.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, the method involves forming a multi-layer charge storing layer including multiple oxynitride layers, such as silicon oxynitride ($Si_2N_2O$) layers, having differing concentrations of Oxygen, Nitrogen and/or Silicon. Generally, the oxynitride layers are formed at higher temperatures than nitride or oxynitride layers in conventional ONO structures, and each of the layers are formed using differing process gases mixtures and/or at differing flow rates. Preferably, the oxynitride layers include at least a top oxynitride layer and a bottom oxynitride layer. More preferably, the stochiometric compositions of the layers is tailored or selected such that the lower or bottom oxynitride has a high oxygen and silicon content, and the top oxynitride layer has high silicon and a high nitrogen concentration with a low oxygen concentration to produce a silicon-rich nitride or oxynitride. The silicon-rich and oxygen-rich bottom oxynitride layer reduces stored charge loss without compromising device speed or an initial (beginning of life) difference between program and erase voltages. The silicon-rich, oxygen-lean top oxynitride layer increases a difference between programming and erase voltages of memory devices, thereby improving device speed, increasing data retention, and extending the operating life of the device.

Optionally, the ratio of thicknesses between the top oxynitride layer and the bottom oxynitride layer can be selected to facilitate forming of the oxynitride layers over a first oxide layer of an ONO structure following the step of forming the first oxide layer using a steam anneal.

An ONO structure and methods for fabricating the same according to various embodiments of the present invention will now be described in greater detail with reference to FIGS. 2 through 4.

Figure 2:
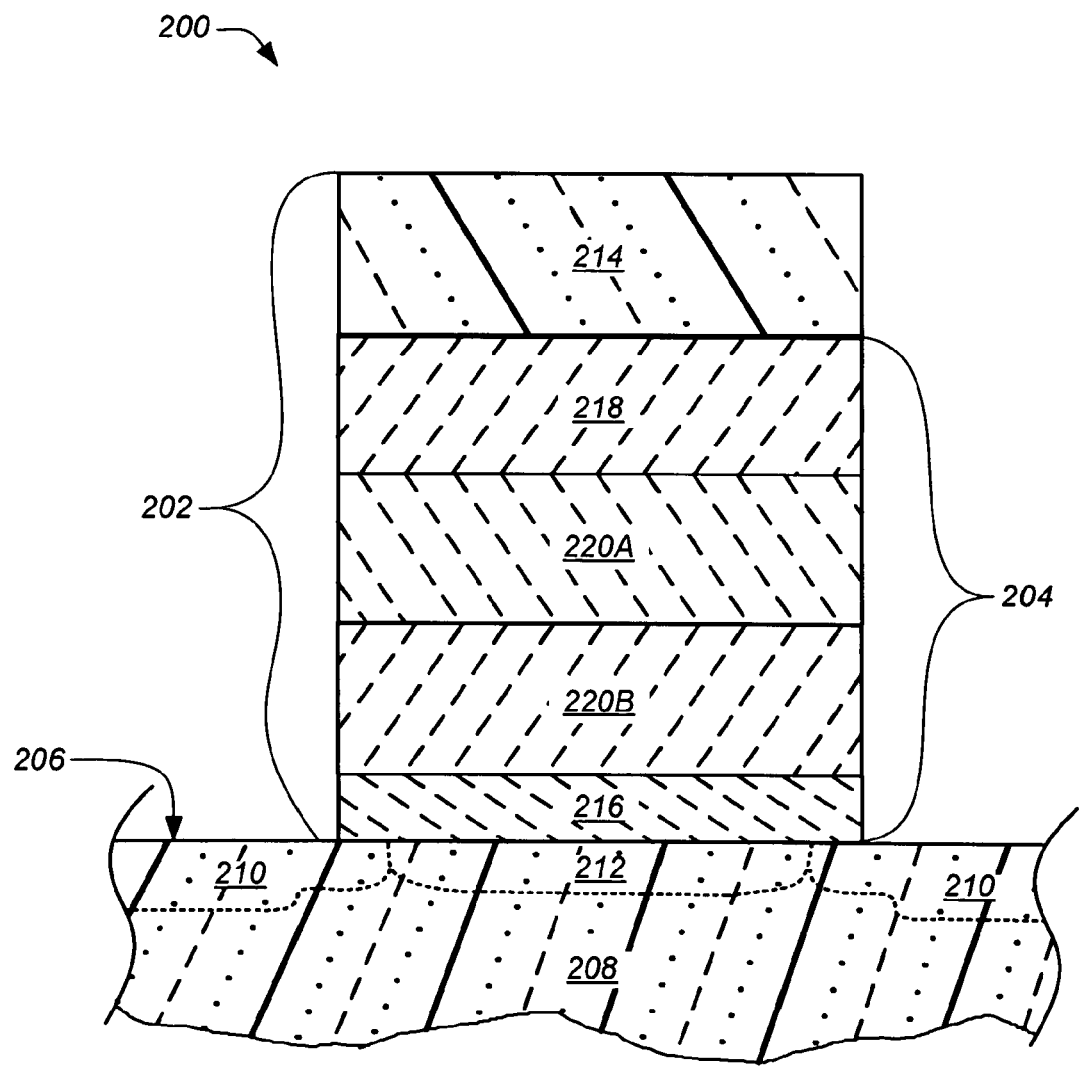
FIG. 2 is a block diagram illustrating a cross-sectional side view of a portion of a semiconductor device having an ONO structure including a multi-layer charge storing layer according to an embodiment of the present invention.

FIG. 2 is a block diagram illustrating a cross-sectional side view of a portion of a semiconductor memory device 200 having an ONO structure including a multi-layer charge storing layer according to one embodiment of the present invention. Referring to FIG. 2, the memory device 200 includes a SONOS gate stack 202 including an ONO structure 204 formed over a surface 206 of silicon layer on a substrate or a silicon substrate 208. In addition, the device 200 further includes one or more diffusion regions 210, such as source and drain regions, aligned to the gate stack 202 and separated by a channel region 212. Generally, the SONOS structure 202 includes a poly-silicon or poly gate layer 214 formed upon and in contact with the ONO structure 204 and a portion of the silicon layer or substrate 208. The poly gate 214 is separated or electrically isolated from the substrate 208 by the ONO structure 204. The ONO structure 204 includes a thin, lower oxide layer or tunneling oxide layer 216 that separates or electrically isolates the gate stack 202 from the channel region 212, a top or blocking oxide layer 218, and a multi-layer charge storing layer including multiple nitride containing layers. Preferably, as noted above and as shown in FIG. 2, the multi-layer charge storing layer includes at least two oxynitride layers, including a top oxynitride layer 220A and a bottom oxynitride layer 220B.

Generally, the substrate 208 may include any known silicon-based semiconductor material including silicon, silicon-germanium, silicon-on-insulator, or silicon-on-sapphire substrate. Alternatively, the substrate 208 may include a silicon layer formed on a non-silicon-based semiconductor material, such as gallium-arsenide, germanium, gallium-nitride, or aluminum-phosphide. Preferably, the substrate 208 is a doped or undoped silicon substrate.

The lower oxide layer or tunneling oxide layer 216 of the ONO structure 204 generally includes a relatively thin layer of silicon dioxide ($SiO_2$) of from about 15 angstrom (A) to about 22 Å, and more preferably about 18 Å. The tunneling oxide layer 216 can be formed or deposited by any suitable means including, for example, being thermally grown or deposited using chemical vapor deposition (CVD). In a preferred embodiment, the tunnel oxide layer is formed or grown using a steam anneal. Generally, the process involves a wet-oxidizing method in which the substrate 208 is placed in a in a deposition or processing chamber, heated to a temperature from about 700° C. to about 850° C., and exposed to a wet vapor for a predetermined period of time selected based on a desired thickness of the finished tunneling oxide layer 216. Exemplary process times are from about 5 to about 20 minutes. The oxidation can be performed at atmospheric or at low pressure.

As noted above, the multi-layer charge storing layer generally includes at least two oxynitride layers having differing compositions of silicon, oxygen and nitrogen, and can have an overall thickness of from about 70 Å to about 150 Å, and more preferably about 100 Å. In a preferred embodiment the oxynitride layers are formed or deposited in a low pressure CVD process using a silicon source, such as silane ($SiH_4$), chlorosilane ($SiH_3Cl$), dichlorosilane ($SiH_2Cl_2$), tetrachlorosilane ($SiCl_4$) or Bis-TertiaryButylAmino Silane (BTBAS), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

For example, the lower or bottom oxynitride layer 220B can be deposited over the tunneling oxide layer 216 by placing the substrate 208 in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, bottom oxynitride layer 220B, that decrease the charge loss rate after programming and after erase, which is manifested in a small voltage shift in the retention mode.

The top oxynitride layer 220A can be deposited over the bottom oxynitride layer 220B in a CVD process using a process gas including $N_2O$, $NH_3$ and DCS, at a chamber pressure of from about 5 mT to about 500 mT, and at a substrate temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that an oxynitride layer produced or deposited under these conditions yields a silicon-rich, nitrogen-rich, and oxygen-lean top oxynitride layer 220A, which improves the speed and increases of the initial difference between program and erase voltage without compromising a charge loss rate of memory devices made using an embodiment of the inventive ONO structure 204, thereby extending the operating life of the device.

Preferably, the top oxynitride layer 220A is deposited sequentially in the same tool used to form the bottom oxynitride layer 220B, substantially without breaking vacuum on the deposition chamber. More preferably, the top oxynitride layer 220A is deposited substantially without altering the temperature to which the substrate 208 was heated during deposition of the bottom oxynitride layer 220B. In one embodiment, the top oxynitride layer 220A is deposited sequentially and immediately following the deposition of the bottom oxynitride layer 220B by decreasing the flow rate of the $N_2O/NH_3$ gas mixture relative to the $DCS/NH_3$ gas mixture to provide the desired ratio of the gas mixtures to yield the silicon-rich, nitrogen-rich, and oxygen-lean top oxynitride layer 220A.

In certain embodiments, another oxide or oxide layer (not shown in these figures) is formed after the formation of the ONO structure 204 in a different area on the substrate or in the device using a steam oxidation. In this embodiment, the top oxynitride layer 220A and top oxide layer 218 of the ONO structure 204 are beneficially steam annealed during the steam oxidation process. In particular, steam annealing improves the quality of the top oxide layer 218 reducing the number of traps formed near a top surface of the top oxide layer and near a top surface of the underlying top oxynitride layer 220A, thereby reducing or substantially eliminating an electric field that could otherwise form across the top oxide layer, which could result in back streaming of charge carriers therethrough and adversely affecting data or charge retention in the charge storing layer.

A suitable thickness for the bottom oxynitride layer 220B has been found to be from about 10 Å to about 80 Å, and a ratio of thicknesses between the bottom layer and the top oxynitride layer has been found to be from about 1:6 to about 6:1, and more preferably at least about 1:4.

The top oxide layer 218 of the ONO structure 204 includes a relatively thick layer of $SiO_2$ of from about 30 Å to about 70 Å, and more preferably about 45 Å. The top oxide layer 218 can be formed or deposited by any suitable means including, for example, being thermally grown or deposited using CVD. In a preferred embodiment, the top oxide layer 218 is a high-temperature-oxide (HTO) deposited using CVD process. Generally, the deposition process involves exposing the substrate 208 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C. Preferably, the top oxide layer 218 is deposited sequentially in the same tool used to form the oxynitride layers 220A, 220B.

More preferably, the oxynitride layers 220A, 220B, and the top oxide layer 218 are formed or deposited in the same tool used to grow the tunneling oxide layer 216. Suitable tools include, for example, an ONO AVP, commercially available from AVIZA technology of Scotts Valley, Calif.

A method or forming or fabricating an ONO stack according to one embodiment of the present invention will now be described with reference to the flowchart of FIG. 3.

Figure 3:
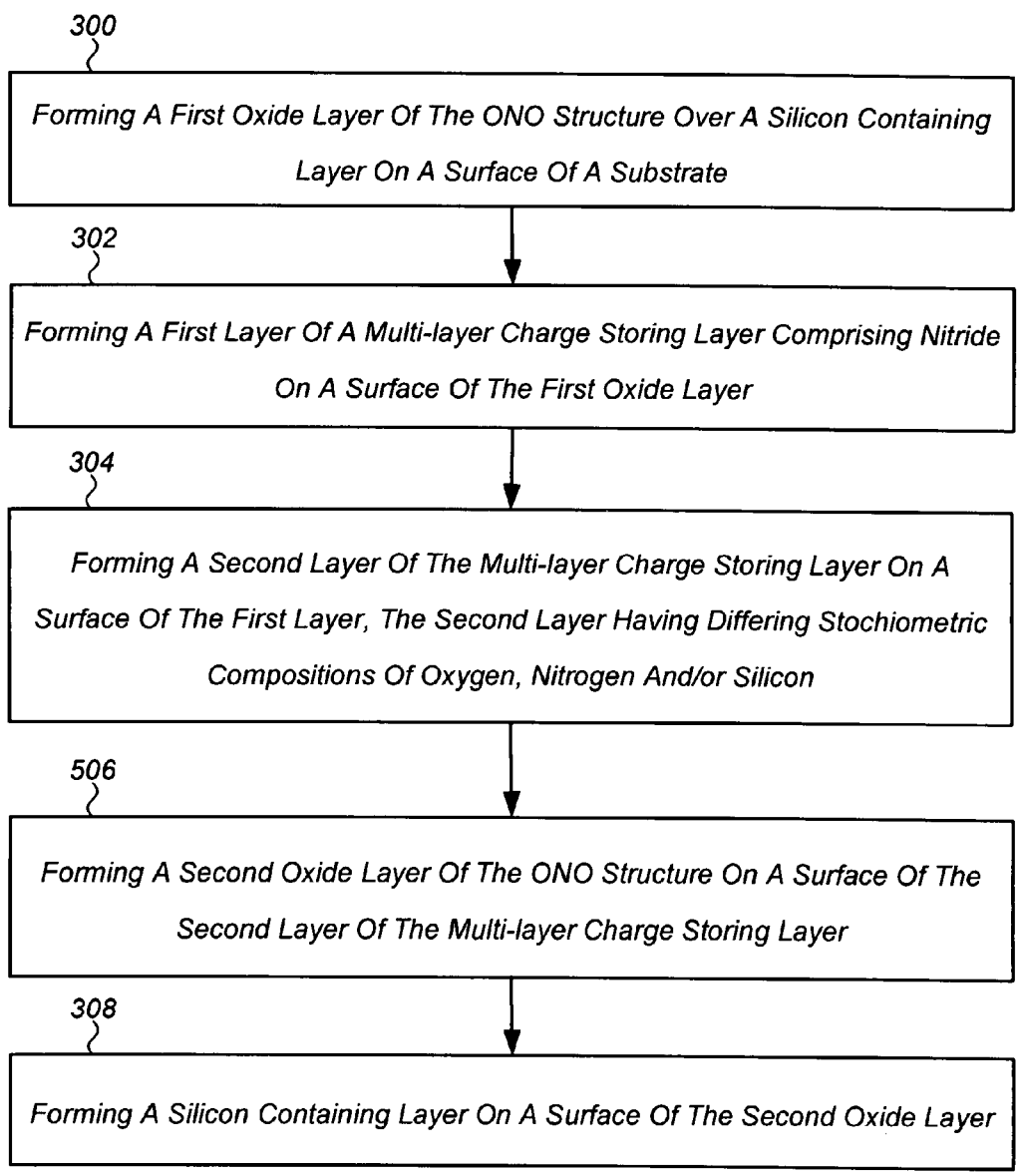
FIG. 3 is flow chart of a method for forming an ONO structure including a multi-layer charge storing layer according to an embodiment of the present invention.

Referring to FIG. 3, the method begins with forming a first oxide layer, such as a tunneling oxide layer, of the ONO structure over a silicon containing layer on a surface of a substrate (step 300). Next, the first layer of a multi-layer charge storing layer including nitride is formed on a surface of the first oxide layer (step 302). As noted above, this first layer or bottom oxynitride layer can be formed or deposited by a CVD process using a process gas including $N_2O/NH_3$ and $DCS/NH_3$ gas mixtures in ratios and at flow rates tailored to provide a silicon-rich and oxygen-rich oxynitride layer. The second layer of the multi-layer charge storing layer is then formed on a surface of the first layer (step 304). The second layer has a stochiometric composition of oxygen, nitrogen and/or silicon different from that of the first layer. In particular, and as noted above, the second or top oxynitride layer can be formed or deposited by a CVD process using a process gas including $DCS/NH_3$ and $N_2O/NH_3$ gas mixtures in ratios and at flow rates tailored to provide a silicon-rich, oxygen-lean top oxynitride layer. Finally, a second oxide layer of the ONO structure is formed on a surface of the second layer of the multi-layer charge storing layer (step 306). As noted above, this top or blocking oxide layer can be formed or deposited by any suitable means, but is preferably deposited in a CVD process. In one embodiment the top or second oxide layer is a high temperature oxide deposited in a HTO CVD process. Alternatively, the top or blocking oxide layer can be thermally grown, however it will be appreciated that in this embodiment the oxynitride thickness must be adjusted or increased as some of the top oxynitride will be effectively consumed or oxidized during the process of thermally growing the blocking oxide layer.

Optionally, the method may further include the step of forming or depositing a silicon containing layer on a surface of the second oxide layer to form a SONOS stack or structure (step 308). The silicon containing layer can be, for example, a polysilicon layer deposited by a CVD process to form a control gate of a SONOS transistor or device.

A comparison of data retention for a memory device using a memory layer formed according to an embodiment of the present invention as compared to a memory device using a conventional memory layer will now be made with reference to FIG. 4. In particular, FIG. 4 illustrates the change in threshold voltage of devices in an electronically erasable programmable read-only memory (EEPROM) during programming (VTP) during erase (VTE) over device life for an EEPROM made using a conventional ONO structure and an ONO structure having a multi-layer oxynitride layer. In gathering data for this figure both devices were pre-cycled for 100K cycles at an ambient temperature of 85° C.

Figure 4:
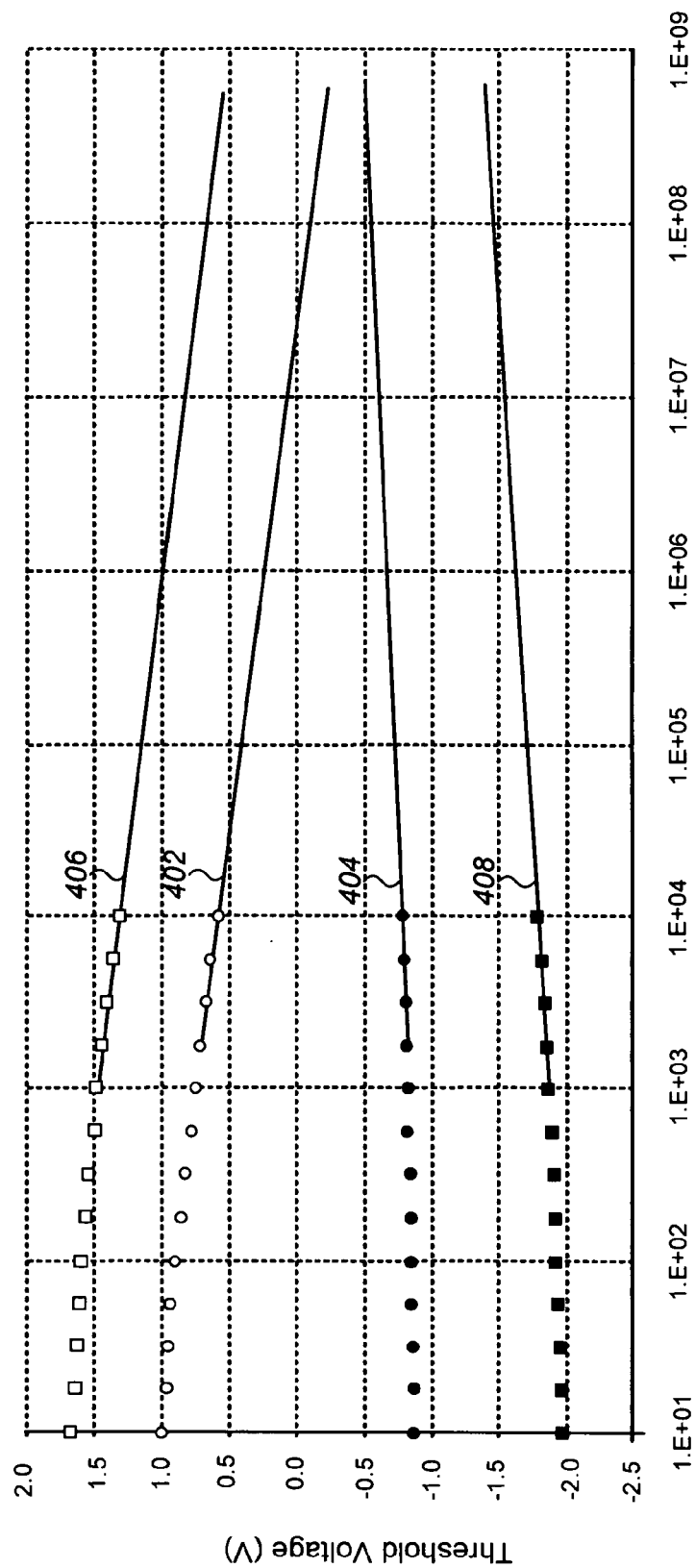
FIG. 4 is a graph showing an improvement in data retention for a memory device using a memory layer formed according to the present invention as compared to a memory device using a conventional memory layer.

Referring to FIG. 4, the graph or line 402 illustrates the change over time of a VTP for an EEPROM made using a conventional ONO structure having a single oxynitride layer without refreshing the memory after the initial writing—program or erase. Actual data points on line 402 are shown by unfilled circles, the remainder of the line showing an extrapolation of VTP to a specified end-of-life (EOL) for the EEPROM. Graph or line 404 illustrates the change over time of a VTE for the EEPROM made using a conventional ONO structure. Actual data points on line 404 are shown by filled circles, and the remainder of the line shows an extrapolation of VTE to EOL for the EEPROM. Generally, the specified difference between the VTE and VTP for an EEPROM at EOL is at least 0.5 V to be able to identify or sense the difference between the program and erase state. As seen from this figure an EEPROM made using a conventional ONO structure has a difference between VTE and VTP of about 0.35V at a specified EOL of 20 years. Thus, an EEPROM made using a conventional ONO structure and operated under the conditions described above will fail to meet the specified operating life by at least about 17 years.

In contrast, the change in VTP and VTE over time for an EEPROM made using an ONO structure having a multi-layer oxynitride layer, illustrated by lines 406 and 408 respectively, shows a difference between VTE and VTP of at least about 1.96V at the specified EOL. Thus, an EEPROM made using an ONO structure according to an embodiment of the present invention will meet and exceed the specified operating life of 20 years. In particular, graph or line 406 illustrates the change over time of VTP for an EEPROM using an ONO structure according to an embodiment of the present invention. Actual data points on line 406 are shown by unfilled squares, the remainder of the line showing an extrapolation of VTP to the specified EOL. Graph or line 408 illustrates the change over time of VTE for the EEPROM, and actual data points on line 408 are shown by filled squares, the remainder of the line showing an extrapolation of VTE to EOL.

Although shown and described above as having only two oxynitride layer, i.e., a top and a bottom layer, the present invention is not so limited, and the multi-layer charge storing layer can include any number, n, of oxynitride layers, any or all of which may have differing stochiometric compositions of oxygen, nitrogen and/or silicon. In particular, multi-layer charge storing layers having up to five oxynitride layers each with differing stochiometric compositions have been produced and tested. However, as will be appreciated by those skilled in the art it is generally desirable to utilize as few layers as possible to accomplish a desired result, reducing the process steps necessary to produce the device, and thereby providing a much simpler and more robust manufacturing process. Moreover, utilizing as few layers as possible also results in higher yields as it is simpler to control the stoichiometric composition and dimensions of the fewer layers.

It will further be appreciated that although shown and described as part of a SONOS stack in a SONOS memory device, the ONO structure and method of the present invention is not so limited, and the ONO structure can be used in or with any semiconductor technology or in any device requiring a charge storing or dielectric layer or stack including, for example, in a split gate flash memory, a TaNOS stack, in a 1T (transistor) SONOS cell, a 2T SONOS cell, a 3T SONOS cell, a localized 2-bit cell, and in a multilevel programming or cell, without departing from the scope of the invention.

The advantages of ONO structures and methods of forming the same according to an embodiment of the present invention over previous or conventional approaches include: (i) the ability to enhance data retention in memory devices using the structure by dividing the oxynitride layer into a plurality of films or layers and tailoring the oxygen, nitrogen and silicon profile across each layer; (ii) the ability to enhance speed of a memory device without compromising data retention; (iii) the ability to meet or exceed data retention and speed specifications for memory devices using an ONO structure of an embodiment of the present invention at a temperature of at least about 125° C.; and (iv) provide heavy duty program erase cycles of 100,000 cycles or more.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of forming a semiconductor device comprising:
   forming a multi-layer charge storing layer comprising depositing on a substrate an oxygen-rich, first oxynitride layer and depositing directly on the first oxynitride layer an oxygen-lean and silicon-rich second oxynitride layer, wherein a stoichiometric composition of the first oxynitride layer comprises a high concentration of oxygen selected to increase retention performance of the multi-layer charge storing layer by acting as a barrier between charge trapped in the second oxynitride layer and the substrate;
   steam annealing the second oxynitride layer to reduce a number of traps formed near a top surface thereof; and
   forming a blocking oxide layer directly on the second oxynitride layer, wherein forming the blocking oxide layer comprises steam annealing the blocking oxide layer to reduce back streaming of charge carriers through the blocking oxide layer.

2. A method according to claim 1, wherein the increased retention performance of the multi-layer charge storing layer increases an end-of-life (EOL) for the semiconductor device at a specified difference between program and erase voltages to at least about 20 years.

3. A method according to claim 1, wherein the first oxynitride layer is formed in a chemical vapor deposition (CVD) process using a process gas comprising a dichlorosilane ($SiH_2Cl_2$)/ammonia ($NH_3$) mixture and a nitrous oxide ($N_2O$)/$NH_3$ mixture at a ratio of about 8:1, and wherein the second oxynitride layer is formed in a CVD process using a process gas comprising a $N_2O$/$NH_3$ mixture and a $SiH_2Cl_2$/$NH_3$ mixture at a ratio of about 5:1.

4. A method according to claim 3, wherein forming the first oxynitride layer and the second oxynitride layer are performed sequentially in a single CVD tool by changing the ratio of the $N_2O$/$NH_3$ and $SiH_2Cl_2$/$NH_3$ mixtures.

5. A method according to claim 1, wherein the first oxynitride layer is formed in a chemical vapor deposition (CVD) process using a process gas comprising a dichlorosilane ($SiH_2Cl_2$)/deuterated-ammonia ($ND_3$) mixture and a nitrous oxide ($N_2O$)/$ND_3$ mixture at a ratio of about 8:1, and wherein the second oxynitride layer is formed in a CVD process using a process gas comprising a $N_2O$/$ND_3$ mixture and a $SiH_2Cl_2$/$ND_3$ mixture at a ratio of about 5:1.

6. A method according to claim 5, wherein the forming the first oxynitride layer and the second oxynitride layer are performed sequentially in a single CVD tool by changing the ratio of the $N_2O$/$ND_3$ and $SiH_2Cl_2$/$ND_3$ mixtures.

7. A method according to claim 1, wherein a thicknesses of the second oxynitride layer is from 1 to 5 times greater than that of the first oxynitride layer.

8. A method comprising:
forming a tunnel oxide layer on a silicon containing layer of a substrate using low pressure oxidation; and
forming a multi-layer charge storing layer on the tunnel oxide layer, forming the multi-layer charge storing layer the comprising:
depositing on the tunnel oxide layer an oxygen-rich, first oxynitride layer; and
depositing directly on the first oxynitride layer an oxygen-lean and silicon-rich second oxynitride layer,
wherein a stoichiometric composition of the first oxynitride layer comprises a high concentration of oxygen selected to increase retention performance of the multi-layer charge storing layer by acting as a barrier between charge trapped in the second oxynitride layer and the substrate.

9. A method according to claim 8, wherein forming the tunnel oxide layer comprises low pressure oxidation in a chemical vapor deposition (CVD) furnace at a low pressure and at a temperature of from about 700° C. to about 850° C.

10. A method according to claim 9, wherein forming the tunnel oxide layer comprises forming the tunnel oxide layer to a thickness of from about 15 Å to about 22 Å.

11. A method according to claim 8, further steam annealing the second oxynitride layer to reduce a number of traps formed near a top surface thereof.

12. A method according to claim 8, wherein the increased retention performance of the multi-layer charge storing layer increases an end-of-life (EOL) for the semiconductor device at a specified difference between program and erase voltages to at least about 20 years.

13. A method according to claim 8, further comprising forming a blocking oxide layer directly on the second oxynitride layer.

14. A method according to claim 13, wherein forming the blocking oxide layer comprises steam annealing the blocking oxide layer to reduce back streaming of charge carriers through the blocking oxide layer.

15. A method comprising:
forming a tunnel oxide layer on a silicon containing layer of a substrate using low pressure oxidation;
forming a multi-layer charge storing layer on the tunnel oxide layer, forming the multi-layer charge storing layer the comprising:
depositing on the tunnel oxide layer an oxygen-rich, first oxynitride layer;
depositing directly on the first oxynitride layer an oxygen-lean and silicon-rich second oxynitride layer having a stoichiometric composition of the first oxynitride layer comprises a high concentration of oxygen to act as a barrier between charge trapped in the second oxynitride layer and the substrate; and
steam annealing the second oxynitride layer to reduce a number of traps formed near a top surface thereof; and
forming a blocking oxide layer directly on the second oxynitride layer.

16. A method according to claim 15, wherein forming the blocking oxide layer comprises steam annealing the blocking oxide layer to reduce back streaming of charge carriers through the blocking oxide layer.

17. A method according to claim 15, wherein forming the tunnel oxide layer comprises forming the tunnel oxide layer to a thickness of from about 15 Å to about 22 Å in a chemical vapor deposition (CVD) furnace at a low pressure and at a temperature of from about 700° C. to about 850° C.

\* \* \* \* \*